(12) United States Patent
Dube et al.

(10) Patent No.: US 6,541,711 B1
(45) Date of Patent: Apr. 1, 2003

(54) ISOLATED GROUND CIRCUIT BOARD APPARATUS

(75) Inventors: David J. Dube, Raleigh, NC (US); Frederic Kozak, Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/576,112

(22) Filed: May 22, 2000

(51) Int. Cl.⁷ .......................... H01R 12/04; H05K 1/11
(52) U.S. Cl. ................. 174/261; 174/255; 174/260
(58) Field of Search .......................... 174/260, 255, 174/36, 261; 361/792, 793, 794, 795, 780, 785, 791

(56) References Cited

U.S. PATENT DOCUMENTS

| | | | | |
|---|---|---|---|---|
| 4,845,311 A | * | 7/1989 | Schreiber et al. | 174/36 |
| 4,906,198 A | * | 3/1990 | Cosimano et al. | 439/82 |
| 5,535,034 A | * | 7/1996 | Taniguchi | 359/152 |
| 5,604,668 A | * | 2/1997 | Wohrstein et al. | 361/816 |
| 5,828,555 A | * | 10/1998 | Itoh | 261/784 |
| 6,160,647 A | * | 10/2000 | Gilliland et al. | 359/110 |

* cited by examiner

Primary Examiner—Albert W. Paladini
Assistant Examiner—Jeremy Norris
(74) Attorney, Agent, or Firm—Hickman Palermo Truong & Becker LLP

(57) ABSTRACT

A circuit board apparatus for terminating shielded conductors having multiple different ground potential values is disclosed. In a signal interconnection region, a multi-layer laminated circuit board comprises a shield termination layer that is capacitively coupled to a separate ground reference layer by a dielectric layer. A signal layer is electrically isolated from both the ground reference layer and shield termination layer by a substrate. A shield of a shielded cable terminates at the shield termination layer of the interconnect region, and a signal conductor of the cable terminates at the signal layer. Buried capacitance is developed between the shield termination layer and the ground reference layer. As a result, RF emissions are minimized and an electrically safe termination of multiple ground sources is provided, without enlarging the surface area of an interconnection. In the specific context of E1/E3 equipment, buried capacitance may be incorporated into the back plane printed circuit board of a unit of telecommunications equipment. As a result, port density may be increased, while maintaining simplicity. The value of the capacitance can be varied by increasing or decreasing the physical area of the plane referenced to the shield of the cable through the connector.

19 Claims, 5 Drawing Sheets

ISOLATED GROUND CIRCUIT BOARD APPARATUS

FIELD OF THE INVENTION

The present invention relates to electronic apparatus such as printed circuit boards. The invention relates more specifically to electronic apparatus such as printed circuit boards that provide isolation among multiple ground conductors having different ground potential.

BACKGROUND OF THE INVENTION

Modern electronic equipment commonly operates using active signals that are generated with reference to a ground potential. However, for a variety of physical and environmental reasons, different electronic systems may operate with different ground potentials. Shielded cables are widely used to conduct and carry electrical signals from one grounded device or system to another. Typically, a shielded cable comprises one or more signal conductors, usually comprising insulated wire, surrounded by one or more shields or ground conductors. The ground conductors are electrically isolated from the signal conductors by a dielectric layer.

Interconnecting systems having different grounding potentials can present a safety hazard when the interconnection is done using shielded cables. The cable shield provides a direct current (DC) electrical interconnection, and can therefore allow currents to flow on the shield, creating a safety hazard. However, shielded cable assemblies do provide a mechanism for reducing radio-frequency (RF) emissions from electronic equipment, and may be required for the systems to meet laws and regulatory standards governing generation of RF emissions or interference by such equipment.

One approach for both achieving safety and meeting RF emission requirements is to AC ground the shield to the system. This provides a high frequency ground path, resulting in reduction of RF emissions, and provides a low frequency DC open, thereby eliminating the flow of DC currents on the shield. However, this approach is undesirable, because it requires capacitors to achieve AC termination. In many circuit board structures, use of such capacitors occupies valuable circuit board space and reduces the maximum number of interconnections that can be fitted into a given area of a board ("interconnection density").

A specific problem that arises in this context relates to deployment of E1/E3 metallic telecommunications equipment in the United Kingdom. Such equipment requires the use of a type 42 coaxial connector. In the connector, the coax shield for the transmit signal is DC grounded, while the coax shield for the receive signal is AC grounded. Providing proper AC grounding requires the use of capacitance referenced to the shield and the system ground. To provide the capacitance, one or more capacitors must be placed on the circuit board where connectors join the board. This consumes space; a reduction in the utilized space would increase port density within a given space.

Based on the foregoing, there is a clear need in the field of electronics for a method and apparatus that provides electrically safe termination of a plurality of ground sources that have different ground potentials.

There is a specific need for a method and apparatus that provides such termination, and that maximizes theoretical interconnection density.

SUMMARY OF THE INVENTION

The foregoing problems and objectives, and other problems and objectives that will become apparent from the following description, are addressed by the present invention, which comprises, in one aspect, a circuit board for terminating shielded conductors having multiple different ground potential values. In a signal interconnection region, a multi-layer laminated circuit board comprises a shield termination layer that is capacitively coupled to a separate ground reference layer by a dielectric layer. A signal layer is electrically isolated from both the ground reference layer and shield termination layer by a substrate. A shield of a shielded cable terminates at the shield termination layer of the interconnect region, and a signal conductor of the cable terminates at the signal layer. Buried capacitance is developed between the shield termination layer and the ground reference layer. As a result, RF emissions are minimized and an electrically safe termination of multiple ground sources is provided, without enlarging the surface area of an interconnection. In the specific context of E1/E3 equipment, buried capacitance may be incorporated into the back plane printed circuit board of a unit of telecommunications equipment. As a result, port density may be increased, while maintaining simplicity. The value of the capacitance can be varied by increasing or decreasing the physical area of the plane referenced to the shield of the cable through the connector.

In one aspect, the invention provides a circuit board, comprising a signal conducting layer adapted for electrically coupling to a signal conductor of a shielded cable; a ground reference layer that is electrically isolated from the signal conducting layer by a substrate; and a shield termination layer that is separated from and capacitively coupled to the ground reference layer by a dielectric layer that is interposed between the ground reference layer and the shield termination layer, and adapted for coupling to a shield of the cable.

One feature of this aspect is a connector having a shield element that is electrically coupled to the shield termination layer and a signal conducting element that is electrically coupled to the signal conducting layer. According to another feature, the ground reference layer is electrically coupled to a ground reference having a different electrical potential than a shield potential that is conducted by the shield reference layer.

In another aspect, a circuit board comprises a signal conducting layer adapted for electrically coupling to a signal conductor of a shielded cable; a plurality of ground reference layers that are electrically isolated from the signal conducting layer by at least one substrate layer; and a plurality of shield termination layers that are interleaved with, separated from and capacitively coupled to the ground reference layers by a plurality of interposed dielectric layers, wherein at least one of the shield termination layers is adapted for coupling to a shield of the cable.

In another aspect, a circuit board has one or more interconnect regions that receive a Type 42 coaxial cable connector, each of the interconnect regions comprising a signal conducting layer adapted for electrically coupling to a signal conductor of a shielded cable that terminates in the connector; a ground reference layer that is electrically isolated from the signal conducting layer by a substrate; a shield termination layer that is separated from and capacitively coupled to the ground reference layer by a dielectric layer, and adapted for coupling to a shield of the cable.

One feature of this aspect comprises at least two (2) interconnect regions consisting of a first interconnect region that receives a transmit connection and a second interconnect region that receives a receive connection, wherein a first shield conductor associated with the transmit connection is grounded to the ground reference layer, and wherein a second shield conductor associated with the receive connection is grounded to the shield termination layer.

Advantageously, the time required to manufacture a circuit board is reduced. Further, a reduction in the amount of time needed to set up a manufacturing line for a particular product may be reduced, thereby improving overall manufacturing efficiency.

Other aspects will become apparent from the appended specification and claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

An isolated ground circuit board apparatus and a method of manufacture are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In general, a buried capacitance laminated printed circuit board is disclosed. By using buried capacitance in a laminated printed circuit board in place of external capacitors in the construction of the interconnection base, the goals of reducing RF emissions and providing electrically safe termination of multiple ground sources are both achieved, without enlarging the surface area of an interconnection.

In the specific context of E1/E3 equipment, buried capacitance may be incorporated into the back plane printed circuit board of a unit of telecommunications equipment. As a result, port density may be increased to the maximum physically possible, while maintaining simplicity.

A capacitor is a passive electronic component that stores energy in the form of an electrostatic field. In its simplest form, a capacitor consists of two conducting plates separated by an insulating material called the dielectric. The capacitance is directly proportional to the surface areas of the plates, and is inversely proportional to the separation between the plates. Capacitance also depends on the dielectric constant of the substance separating the plates. In embodiments as described here, the value of the capacitance can be varied by increasing or decreasing the physical area of the plane referenced to the shield of the cable through the connector. Multiple core laminates may also be used to vary the capacitance value.

Figure 1:
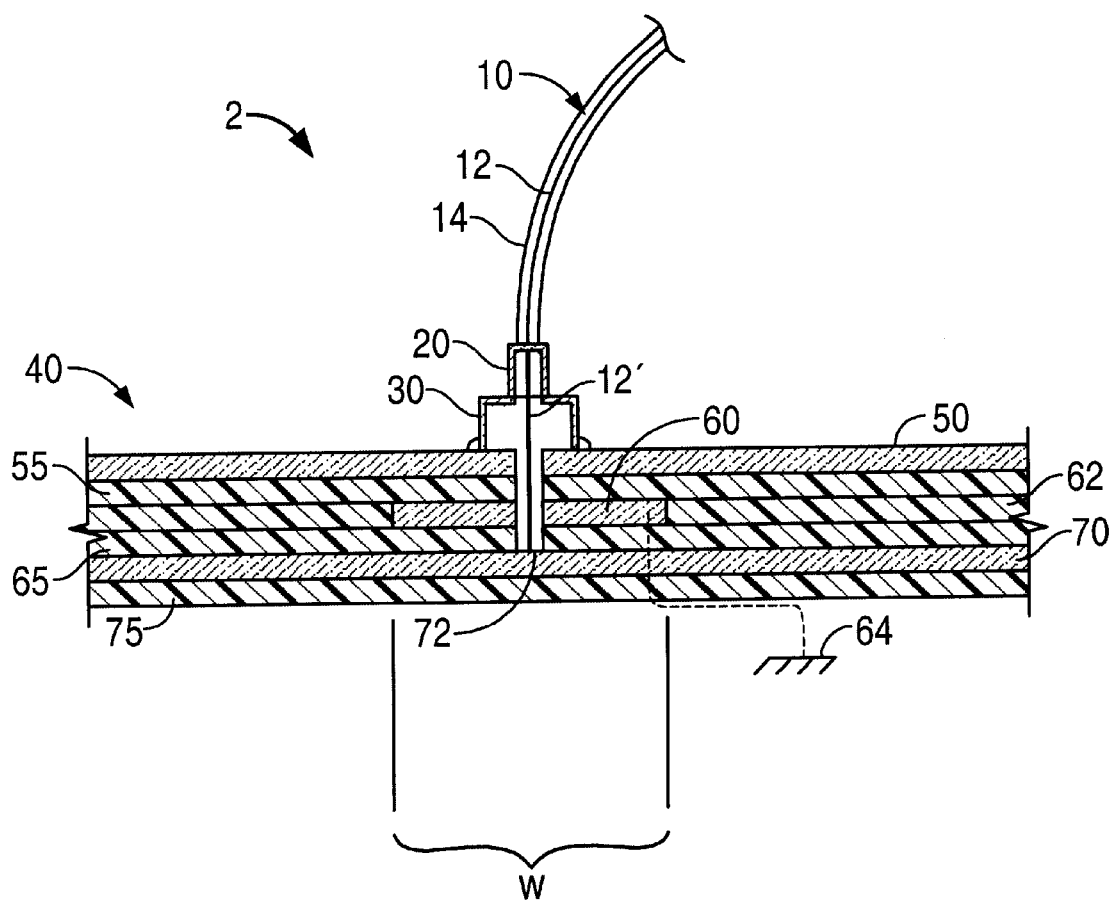
FIG. 1 is a part section view of a circuit board assembly in the region of a single cable interconnect.

FIG. 1 is a simplified part section view of an exemplary circuit board assembly 2 that generally comprises a cable 10, male connector 20, female connector 30, and circuit board 40. Cable 10 typically is a shielded cable, such as a coaxial cable, and comprises a signal conductor 12 and a shield 14. Cable 10 mechanically terminates in male connector 20, which has a signal element that is electrically coupled to signal conductor 12, and a ground element that is coupled to shield 14.

The arrangement of connectors 20, 30, and circuit board 40 is merely one example of a variety of structures that may be used to couple signal conductor 12 to the circuit board. For example, the gender of the connectors may be reversed. Connectors 20, 30 represent a jack and plug of a coaxial cable connection. In the case of coax, one cable connector fits or screws over the other. One connector end of the cable, when connected to the board, grounds the shield. Any type of conductor, excluding a shield, of any type of cable may terminate at circuit board 40 in the signal layer.

In an embodiment, circuit board 40 comprises one or more interconnections featuring buried capacitance laminates for one or more connectors such as connectors 20, 30. Board 40 may be a back plane, carrier board, other printed circuit board, or an equivalent.

In use, connector 20 is mechanically connected to female connector 30, which is mounted on circuit board 40. Female connector 30 has a receiving signal element that mechanically receives and is electrically coupled to signal element, and a receiving ground element that mechanically receives and is electrically coupled to the ground element of connector 20. Connector 30 may be secured to circuit board 40 in any mechanically rigid manner. For example, connector 30 may have one or more solder tabs that are received in matching holes in board 40 and soldered in place. Screws, interlocking elements, or other methods of securing connector 30 to board 40 may be used. Connector 20 may mate to connector 30 in any suitable mechanical manner such as by bayonet mount, plug connection, etc.

Circuit board 40 generally comprises a shield termination layer 50, ground reference layer 60, and signal layer 70. Shield termination layer 50, ground reference layer 60, and signal layer 70 each comprise a generally planar layer of a conductive material such as copper sheet or copper foil. A dielectric layer 55 is interposed between shield termination layer 50 and ground reference layer 60. The specific material used for dielectric layer 55 is not critical, provided that it permits buried capacitance to be developed between shield termination layer 50 and ground reference layer 60.

As indicated in FIG. 1 by the dimension lead lines that define width W, ground reference layer 60 has an overall width that is generally confined to the region disposed substantially directly below connectors 20, 30. Layers 50, 55, 60 form a buried capacitance core laminate in the region of an interconnection. The amount of buried capacitance developed between shield termination layer 50 and ground reference layer 60 may be adjusted by modifying width W of the ground reference layer, or by increasing the thickness of dielectric layer 55. A substrate layer 62 may surround ground reference layer in the region away from connectors 20, 30 for the purpose of separating shield termination layer 50 from other layers of circuit board 40.

A substrate layer 65 is interposed between ground reference layer 60 and signal layer 70 for the purpose of electrically insulating the signal layer. An additional substrate layer 75 may be provided as a structural base or terminating layer of the circuit board 40. Each of the substrate layers 65, 75 comprises a generally planar sheet of a non-conductive material such as a plastic, phenolic, epoxy-glass composite, etc. A terminal portion 12' of the signal conductor 12 of cable 10 extends through a hole in layers 50, 55, 60, 65 and is electrically and mechanically coupled to signal layer 70 at terminal 72.

Circuit board 40 may be constructed in the layers described above using conventional lamination techniques that are used to create multi-layer printed circuit boards.

Figure 2:
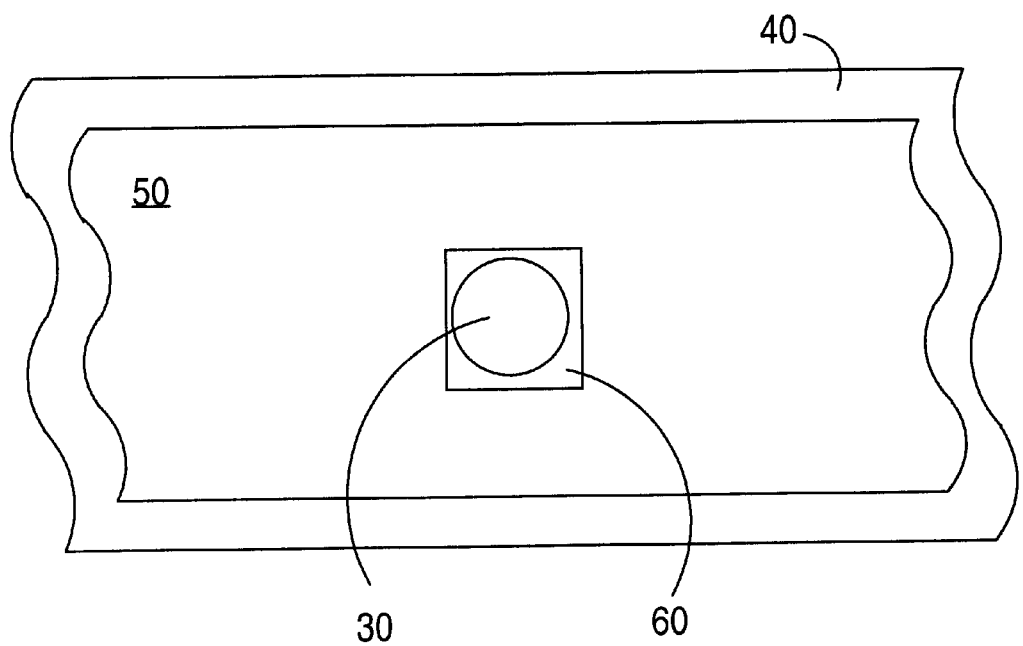
FIG. 2 is a simplified, non-scale plan view that shows the relative area of layers of the circuit board of FIG. 1.

As described herein, shield termination layer 50 is electrically capacitively coupled to ground reference layer 60, and layers 50, 55, 60 form a BC core laminate in the region of an interconnection. FIG. 2 shows, in a simplified plan view that is not presented to scale, the relative area of shield termination layer 50 and ground reference layer 60 in the area of a single cable interconnection of connector 30 to circuit board 40. The relative difference in overall planar area of ground reference layer 60 compared to the other layers is dependent upon the desired amount of capacitance. Generally, ground reference layer will have a relatively small overall planar area compared to the other layers. Signal layer 70 may comprise a relatively narrow trace, a plurality of traces, or a larger planar region of conductive material.

In this configuration, the shield 14 of the cable 10 is electrically referenced to shield termination layer 50 of the core laminate through connectors 20, 30, while the ground reference layer 60 of the laminate is referenced to ground, as indicated by ground symbol 64 of FIG. 1. The amount of capacitance of the laminate is modified or trimmed by changing the area of the ground reference layer 60.

In a preferred embodiment, the shield reference layer 50 is isolated from the rest of the board. The ground layer is capacitively coupled to the shield reference layer, and is referenced to frame ground, logic ground, or another ground reference, as indicated by ground symbol 64 of FIG. 1. The particular type of ground reference is not critical, and may depend upon the grounding scheme of the system in which the board is used.

Any connector that allows for the termination of a shield of a cable may be used for connectors 20, 30. For example, BNC, APC-7 SMA, N type, APC-3.5, D subminiature, miniature D subminiature, IDC with shield termination, and other connectors may be used.

Cable 10 may be any cable that includes a shield element or otherwise carries a ground signal. Further, the shield layer may be constructed using any material that can serve as a ground conductor. For example, the cable may have a shield comprising metal braid over conductive foil, conductive foil, or braid. Coax cable or the equivalent may be used.

Figure 3:
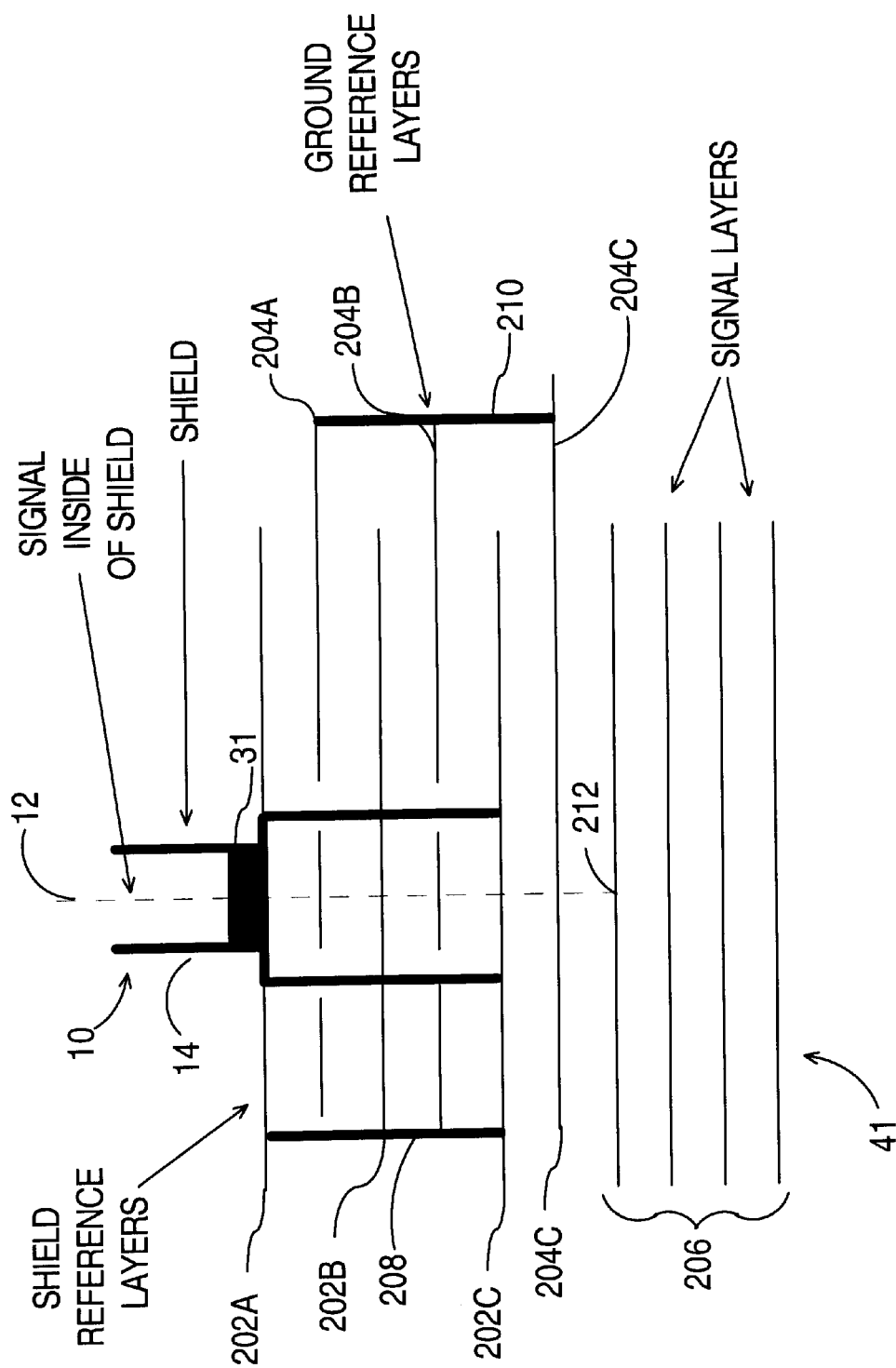
FIG. 3 is a simplified side section view of a circuit board featuring a plurality of ground reference layers and a plurality of shield termination layers.

Multiple core laminates may also be used to vary the capacitance value. FIG. 3 is a simplified section view of a multi-layer laminated circuit board 41. As in FIG. 1, cable 10 has a signal conductor 12 and a shield 14 that terminates on a surface of circuit board 41 at connector 31. A plurality of ground reference layers 204A, 204B, 204C, etc. are sandwiched between a plurality of shield reference layers 202A, 202B, 202C. Each ground reference layer is mechanically and electrically separated from an adjacent shield reference layer by a dielectric layer. Bar 208 indicates that all the shield reference layers 202A, 202B, 202C are conductively coupled together. Similarly, bar 210 indicates that all ground reference layers 204A, 204B, 204C are conductively coupled.

Signal conductor 12 terminates at point 212 at one or more signal conducting layers 206 that are separated from the laminate of shield reference layers and ground reference layers.

Using the multi-layer configuration of FIG. 3, capacitance is developed across the layers in an amount greater than that developed using a two-layer configuration.

Figure 4A:
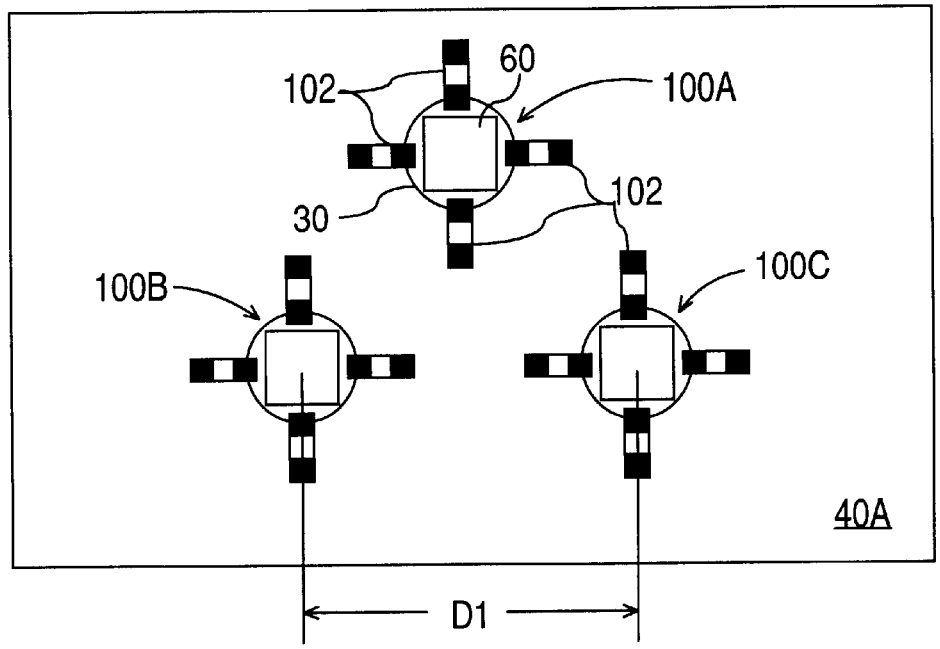
FIG. 4A is a simplified top plan view of a plurality of connectors for telecommunication ports illustrating port density of a prior approach.

FIG. 4A is a simplified top plan view of a plurality of connectors for telecommunication ports illustrating port density of a prior approach. In this approach, a plurality of interconnects 100A, 100B, 100C, etc. are disposed on a circuit board 40A. At each interconnect, a plurality of capacitors 102 are disposed generally radially around connector 30 and are electrically coupled to a shield of the connector to provide shield termination. As a result, the minimum practical spacing between adjacent ports or interconnections is approximately equal to distance D1.

Figure 4B:
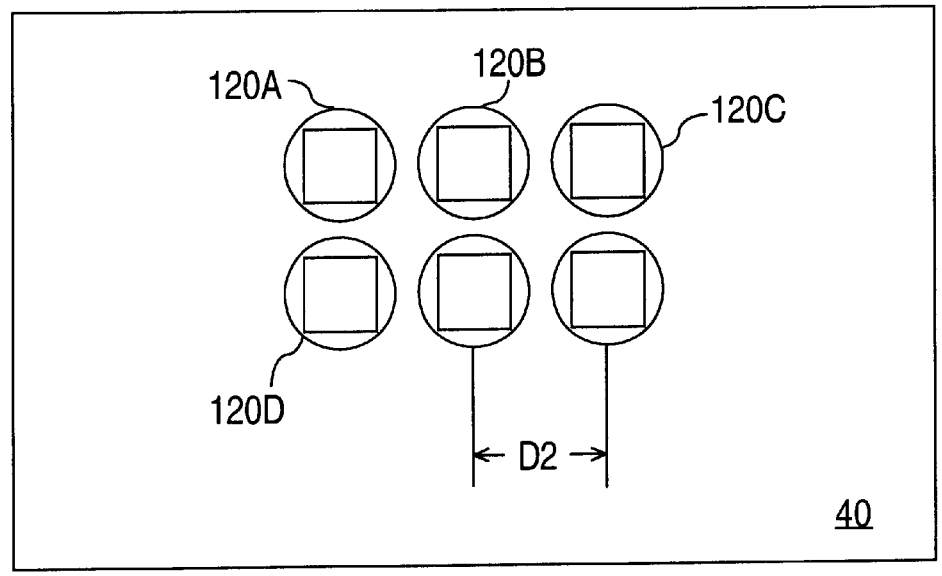
FIG. 4B is a simplified top plan view of a plurality of connectors for telecommunication ports illustrating port density that may be achieved in a circuit board that is constructed according to an embodiment.

FIG. 4B is a simplified top plan view of a plurality of connectors for elecommunication ports illustrating port density that may be achieved in a circuit board that is constructed according to an embodiment. A plurality of interconnections 120A, 120B, etc. are disposed on circuit board 40. Because circuit board 40 uses buried capacitance laminated construction, external capacitors are not required. The minimum spacing between adjacent ports is given by D2. A comparison of FIG. 4A to FIG. 4B illustrates that D2 is substantially less than D1, such that a larger number of interconnections will fit into the same overall planar area when an embodiment is practiced rather than the prior approach.

Figure 5:
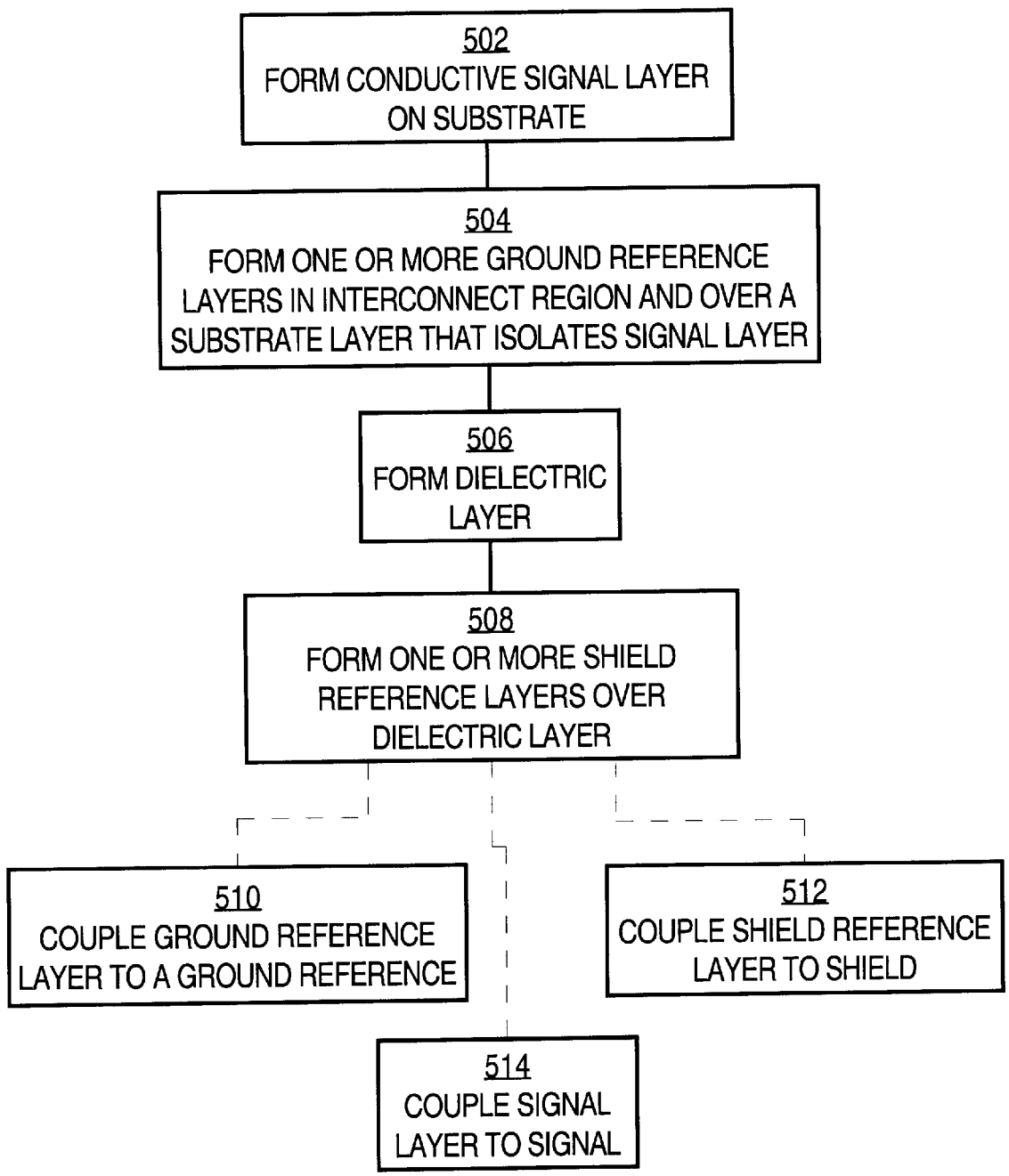
FIG. 5 is a flow diagram of a process of manufacturing a circuit board.

FIG. 5 is a flow diagram of an exemplary process of manufacturing a circuit board. The steps shown in FIG. 5 are merely exemplary, and the manufacturing process used for a circuit board that uses the approach described herein may require using one or more fewer or additional steps.

In block 502, a conductive signal layer is formed on a substrate. For example, block 502 may involve forming a generally planar layer of conductive material over an insulating base or other layer, as shown by layer 70 of FIG. 1.

In block 504, one or more ground reference layers are formed in the region of an interconnection, and over a substrate layer that electrically isolates the signal layer from the ground reference layers. The ground reference layers may comprise a single layer as in the case of ground reference layer 60 of FIG. 1, or a plurality of layers arranged in a laminated or sandwiched manner as in FIG. 3.

In block 506, a dielectric layer is formed. In a preferred embodiment, the dielectric layer is formed on the one or more ground reference layers, preferably in a spatial location opposite from the substrate layer that separates the ground reference layers from the signal layer. For example, in the embodiment of FIG. 1, dielectric layer 55 is formed above ground reference layer 60 on the upper face of the ground reference layer and away from the lower face of the ground reference layer that contacts substrate layer 65.

In block 508, one or more shield reference layers are formed over the dielectric layer. Preferably, one shield reference layer is formed for each interconnection location, such that a shield element of a cable connector may be electrically coupled to the shield reference layer for providing termination. As an example, shield reference layer 50 of FIG. 1 is formed on the dielectric layer 55.

The process of block 502, block 504, block 506, and block 508 results in a circuit board having a buried capacitance laminate construction in the region of one or more interconnections. Optionally, the steps of block 510, block 512, and block 514 may be carried out to establish electrically useful ground references for certain layers of the completed circuit board. However, the steps of block 510, block 512, and block 514 are not required as part of a process of manufacturing a circuit board per se.

In block 510, the ground reference layer is coupled to a ground reference. The ground reference comprises any conductor or conductive surface that is held at ground potential by a system in which the circuit board forms a part. For example, conductors having potential values at chassis ground, frame ground, logic ground, etc., may be used.

In block 512, the shield reference layer is coupled to a shield element. In a preferred embodiment, block 512 involves electrically and mechanically joining a shield of a cable connector to the shield reference layer, e.g., by soldering.

In block 514, the signal layer is coupled to a signal conductor. For example, block 514 may involve electrically or mechanically joining a coaxial cable conductor to the signal layer, as by soldering.

Accordingly, a printed circuit board apparatus that isolates multiple different ground potential values, and a related manufacturing method, has been described. In the specific context of E1/E3 equipment, buried capacitance may be incorporated into the back plane printed circuit board of a unit of telecommunications equipment. As a result, port density may be increased to the maximum physically possible, while maintaining simplicity. The value of the buried capacitance can be varied by increasing or decreasing the physical area of the plane referenced to the shield of the cable through the connector.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A circuit board, comprising:
a signal conducting layer adapted for electrically coupling to a signal conductor of a shielded cable;
a ground reference layer that is electrically isolated from the signal conducting layer by a substrate;
a shield termination layer that is separated from and capacitively coupled to the ground reference layer by a dielectric layer that is interposed between the ground reference layer and the shield termination layer, and adapted for coupling to a shield of the cable.

2. A circuit board as recited in claim 1, further comprising a connector having a shield element that is electrically coupled to the shield termination layer and a signal conducting element that is electrically coupled to the signal conducting layer.

3. A circuit board as recited in claim 1, wherein the ground reference layer is electrically coupled to a ground reference having a different electrical potential than a shield potential that is conducted by the shield reference layer.

4. A circuit board as recited in claim 1, wherein the ground reference layer is electrically coupled to a frame ground reference having a different electrical potential than a shield potential that is conducted by the shield reference layer.

5. A circuit board as recited in claim 1, wherein the ground reference layer is electrically coupled to a logic ground reference having a different electrical potential than a shield potential that is conducted by the shield reference layer.

6. The circuit board of claim 1 in which:
the signal conducting layer is formed on a substrate;
the ground reference layer that is electrically isolated from the signal conducting layer by the substrate is formed thereupon;
the shield termination layer that is separated from and capacitively coupled to the ground reference layer by the dielectric layer that is interposed between the ground reference layer and the shield termination layer is formed thereupon;
the shield element of the a cable is electrically coupled to the shield termination layer;
the signal conducting element of the cable is electrically coupled to the signal conducting layer;
and the ground reference layer is electrically coupled to a ground reference having a different electrical potential than a shield potential that is conducted by the shield reference layer.

7. A circuit board, comprising:
at least one signal conducting layer adapted for electrically coupling to a signal conductor of a shielded cable;
a plurality of ground reference layers that are electrically isolated from the signal conducting layer by at least one substrate layer;
a plurality of shield termination layers that are interleaved with, separated from and capacitively coupled to the ground reference layers by a plurality of interposed dielectric layers, wherein at least one of the shield termination layers is adapted for coupling to a shield of the cable.

8. A circuit board as recited in claim 7, further comprising a connector having a shield element that is electrically coupled to at least one of the shield termination layers and a signal conducting element that is electrically coupled to the signal conducting layer.

9. A circuit board as recited in claim 7, wherein the ground reference layers are electrically coupled to a ground reference having a different electrical potential than a shield potential that is conducted by the shield reference layers.

10. A circuit board as recited in claim 7, wherein the ground reference layers are electrically coupled to a frame ground reference having a different electrical potential than a shield potential that is conducted by the shield reference layers.

11. A circuit board as recited in claim 7, wherein the ground reference layers are electrically coupled to a logic ground reference having a different electrical potential than a shield potential that is conducted by the shield reference layers.

12. The circuit board of claim 7 in which:
the at least one signal conducting layer is formed on the at least one substrate layer;
the plurality of ground reference layers that are electrically isolated from the signal conducting layers by the at least one substrate layer are formed thereupon;
the plurality of shield termination layers that are interleaved with, separated from and capacitively coupled to the ground reference layers by the plurality of interposed dielectric layers are formed thereupon;

the shield element of the cable is electrically coupled to at least one of the shield termination layers;

the signal conducting element of the cable is electrically coupled to the signal conducting layer;

and the ground reference layers are electrically coupled to a ground reference having a different electrical potential than a shield potential that is conducted by the shield reference layers.

13. A circuit board comprising one or more interconnect regions that receive a coaxial cable connector that DC grounds a coax shield for transmit signals and AC grounds a coax shield for receive signals, each of the interconnect regions comprising:

one or more signal conducting layers adapted for electrically coupling to a signal conductor of a shielded cable that terminates in the connector;

a ground reference layer that is electrically isolated from the one or more signal conducting layers by a substrate;

a shield termination layer that is separated from and capacitively coupled to the ground reference layer by a dielectric layer, and adapted for coupling to a shield of the cable.

14. A circuit board as recited in claim 13, further comprising a connector having a shield element that is electrically coupled to the shield termination layer and a signal conducting element that is electrically coupled to the one or more signal conducting layers.

15. A circuit board as recited in claim 13, wherein the ground reference layer is electrically coupled to a ground reference having a different electrical potential than a shield potential that is conducted by the shield reference layer.

16. A circuit board, comprising one or more interconnect regions that receive a coaxial cable connector that DC grounds a coax shield for transmit signals and AC grounds a coax shield for receive signals, each of the interconnect regions comprising:

a signal conducting layer adapted for electrically coupling to a signal conductor of a shielded cable that terminates in the connector;

a plurality of ground reference layers that are electrically isolated from the signal conducting layer by at least one substrate layer;

a plurality of shield termination layers that are interleaved with, separated from and capacitively coupled to the ground reference layers by a plurality of interposed dielectric layers, wherein at least one of the shield termination layers is adapted for coupling to a shield of the cable.

17. A circuit board as recited in claim 16, further comprising a connector having a shield element that is electrically coupled to at least one of the shield termination layers and a signal conducting element that is electrically coupled to the signal conducting layer.

18. A circuit board as recited in claim 16, wherein the ground reference layers are electrically coupled to a ground reference having a different electrical potential than a shield potential that is conducted by the shield reference layers.

19. A circuit board as recited in claim 16, wherein the ground reference layers are electrically coupled to a frame ground reference having a different electrical potential than a shield potential that is conducted by the shield reference layers.

* * * * *